United States Patent [19]

Spruijt

[11] Patent Number: 4,622,509

[45] Date of Patent: Nov. 11, 1986.

[54] METHOD OF AND CIRCUIT FOR NI-CD BATTERY CHARGE CONTROL

[75] Inventor: H. J. N. Spruijt, Wassenaar, Netherlands

[73] Assignee: Agence Spatiale Europeenne, Paris, France

[21] Appl. No.: 550,195

[22] Filed: Nov. 9, 1983

[30] Foreign Application Priority Data

Oct. 25, 1983 [FR] France .................................. 83 16951

[51] Int. Cl.$^4$ ................................................ H02J 7/04
[52] U.S. Cl. ................................................ 320/36; 320/5
[58] Field of Search ............................ 320/2, 5, 35, 36

[56] References Cited

U.S. PATENT DOCUMENTS

3,350,618 10/1967 Barney et al. .......................... 320/5
4,328,457 5/1982 Higuchi ................................. 320/36

Primary Examiner—Patrick R. Salce
Assistant Examiner—Anita M. Ault
Attorney, Agent, or Firm—Oblon, Fisher, Spivak, McClelland & Maier

[57] ABSTRACT

Method of and circuit for Ni-Cd battery charge control, particularly on low earth orbit spacecraft, according to which battery charge is terminated when the battery temperature starts to increase following a decrease at the end of charge. The temperature of the battery is sensed at individual cell level by means of thermistors placed preferably at the geometric center of thin metal plates between the isolated cells, these plates being fixed to a common metal base plate.

7 Claims, 14 Drawing Figures

METHOD OF AND CIRCUIT FOR NI-CD BATTERY CHARGE CONTROL

BACKGROUND OF THE INVENTION

1. Field of the Invention

The present invention relates to a method of and a circuit for Ni-Cd battery charge control, for batteries which are used on low earth orbit spacecraft missions.

2. Discussion of the Background

Orbit time for such missions being typically about 1.5 hours of which about 1 hour in sunlight, during which period the battery needs to be charged, and about 0.5 hour in eclipse, during which period the battery is discharged, the battery charge and discharge rates are very high: for example, the batteries can experience up to 6000 discharge/charge cycles per year exclusive of peak load demands.

High charge currents and fast recharge require moderately complex electronics for controlling overcharge and for preventing undesirable battery heating.

With regard to battery overheating, it is difficult to correctly specify simple temperature-sensitive controls which would ensure energy balance, provide overcharge protection and control thermal dissipation throughout a mission wth changing environment and battery I-V characteristics.

Existing methods of battery charge control for spacecraft are outlined below:

current-limited or constant-current charging is a technique according to which a regulator limits charge current to one or more selected values. Charge termination is based on the measurement of battery voltage. If this voltage reaches a value corresponding to a defined recharge ratio, charging is switched to a lower current limit;

voltage-limited charging is a technique according to which the current rate is controlled indirectly during overcharge. A regulator limits battery-charge voltage so as to reduce charge current from an initial value to a lower value that corresponds to a taper charge rate. Here again, charge termination depends on the reaching of a battery voltage limit;

pressure-limited charging is based on the fact that oxygen is developed at an increasing rate as the point of full charge is approached and, depending on the rate of simultaneous recombination of the gas, a net pressure increase will occur within the cell. The rise in pressure can be used to generate a signal for charge control. A disadvantage of this method is that it required cell modification in order to sense the pressure by gages or by an auxiliary electrode. The reliability of this method has, so far, not proved to be very high;

temperature-limited charging is based on the fact that the heat rate of a battery increases as it nears the fully charged state at constant current. Battery temperature is thus a useful alternative to battery voltage for use as a signal that overcharge is commencing. The effectiveness of the method depends on the thermophysical properties of the cell and the particular battery-system design application. With short cycles and high rate charging and a temperature sensor attached to the cell container cover, there is not sufficient time for the electrode stack to absorb the heat produced and to exhibit a temperature rise before the end of charge period. Therefore, application of this method has been limited to geosynchronous missions where time scales are more favourable in view of the long-period orbits. A problem with temperature-limited charging is that battery tmperature may also increase due to external heat inputs, and not only due to charging.

The charging-techniques as described above, which are all based on constant current charge up to a defined end of charge voltage level, which is battery temperature dependent, followed by a gradually reducing current keeping the battery voltage at a defined end of charge voltage level for the remainder of the charging time, have drawbacks when applied to low earth orbit missions. Tests have shown that battery behavior is unpredictable in low earth orbit applications, whihc is believed to be mainly caused by incorrect battery charge termination associated with the known charging techniques. Another problem is the waste of solar array charging power due to the charging techniques used, requiring 30% more solar array power than the average power theoretically required. This is because the battery charging current is not constant during the complete charging period, but is reduced upon the reaching of a defined battery voltage limit or upon a rise in battery pressure or temperature

SUMMARY OF THE INVENTION

It is an object of the present invention to provide a method of charge control for Ni-Cd batteries, used in particular on low earth orbit spacecraft missions, which responds better to the necessities of practice than the methods intended for the same purpose known previously, namely:

in that the battery charge termination is established in a precise way;

in that battery behaviour is predictable;

in that approximately 30% less solar array charging power is required in comparison with the known methods;

in that the battery cycle life is longer than that corresponding to the known techniques, since the battery degrades linearly during only the first few hundred cycles until steady state has been reached, after which no further degradation is observed;

in that the battery charge termination is virtually independent of the environmental temperature fluctuations, which makes the battery cell temperature measurments according to the present invention more reliable than those described in the prior art.

According to the present invention there is provided a method of charge control for Ni-Cd batteries, which are in particular used on low earth orbit spacecraft, and the individual battery cells of which are electrically isolated by means of a thermally conductive material with thin metal plates between the isolated battery cells fixed to a common metal base plate, the method comprising battery charge termination when the battery temperature starts to increase following a decrease at the end of charge.

According to an advantageous embodiment of the method according to the invention, battery temperature measurement is carried out at individual battery cell level.

According to an advantageous feature of this embodiment, the temperatures at the location of said thin metal plates are used to terminate battery charge by means of suitable temperature sensors.

According to the invention, said temperature sensors are thermistors, preferably located at the geometrical centers of said thin metal plates, the thermistors between these latter being interconnected in a series-parallel configuration.

It is also an object of the present invention to provide a circuit allowing Ni-Cd batteries, used in particular on a low earth orbit spacecraft, to be charged by a solar array means during the sunlight period of said spacecraft when a switch S of this circuit is closed, said batteries having individual battery cells electrically isolated by means of a thermally conductive material with thin metal plates between the isolated battery cells fixed to a common metal base plate, wherein said circuit comprises end-of-charge detector means which provide, at the end of charge, when the battery temperature starts to increase following a decrease, a signal to open said switch S which stays open for the remainder of the sunlight period.

According to an advantageous embodiment of the circuit according to the invention, said solar array means are sized for generating a current slightly greater than the average charging current theoretically required.

According to another advantageous embodiment of the circuit according to the invention, said end-of-charge detector means comprise temperature sensor means consisting of a set of thermistors, which are placed at special locations, preferably at the geometrical centers of said thin metal plates, and which are interconnected in a series-parallel configuration.

According to yet another advantageous embodiment of the circuit according to the invention, said end-of-charge detector means comprise a first operational amplifier of appropriate gin, the positive input of which is connected to the voltage that appears across said set of thermistors, when a current of predetermined intensity is passed through it, and the negative input of which is connected to a reference voltage which is the output voltage of a second operational amplifier, the negative input of which is connected directly to its output and the positive input of which is periodically connected to the output of said first operational amplifier via a switch $S_1$, thus forcing said reference voltage to be identical to said voltage across the set of thermistors each time switch $S_1$ is closed, whereas said reference voltage remains constant, by means of an earthed capacitor, during the time that said switch $S_1$ is open, and to be equal, during this time, to the value the voltage across the set of thermistors has when said switch $S_1$ is closed, the output voltage of said first amplifier increasing linearly from the voltage across the set of thermistors when the temperature decreases, namely during battery charge, whereas it decreases linearly from said voltage across the set of thermistors when the battery temperature increases, namely during battery discharge, in order that said first operational amplifier amplifies, according to its predetermined gain, the voltage difference between the voltage across the set of thermistors and the reference voltage only during the time that said switch $S_1$ is open.

According to an advantageous feature of this embodiment, the ouput voltages of said first and second operational amplifiers are compared by a logic circuit which detects the end of charge during the sunlight phase of an orbit, when the battery temperature starts to increase, for a difference between said output voltages whose modulus is equal to a prefixed minimal threshold to which corresponds a minimal positive temperature derivative level, thus switching off said switch S of the charge circuit with the help of relay means.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
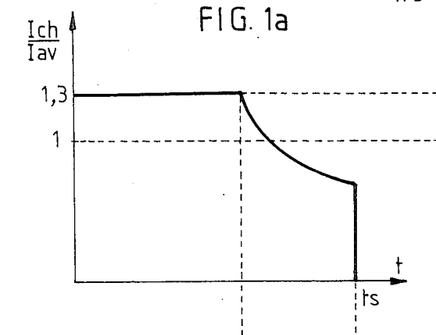
FIGS. 1a and 2a illustrate I-V characteristics for the conventional charging methods.
Figure 2A:
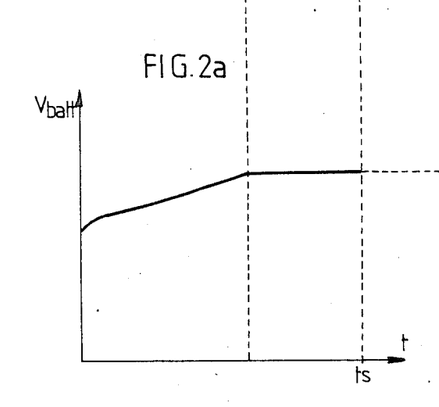
Figure 2B:
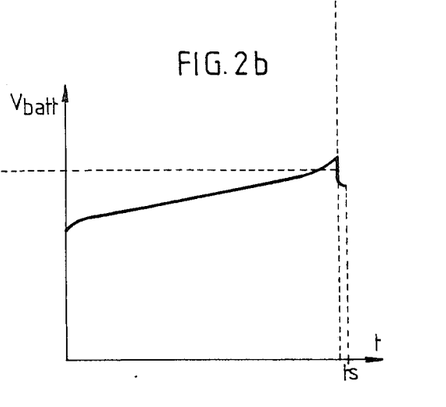

Referring now to the drawings, wherein like reference numerals designate identical or corresponding parts throughout the several views, and more particularly to FIGS. 1a and 2a there is illustrated a battery charge current $I_{ch}$ referred to the average charging current $I_{av}$ theoretically required, as well as battery voltage $V_{batt}$, against time, for a typical low earth orbit application, according to the conventional charging methods; these figures show that the known methods are all based—as already stated—on constant current charge up to a defined end of charge voltage level, which is battery temperature dependent, followed by a gradually reducing current keeping the battery voltage at a defined end of charge voltage level for the remainder of the charging time.

More in particular, FIG. 1a shows that, for the known methods, 30% more solar array power is required than the average power theoretically necessary, because the battery charging current $I_{ch}$ is not constant during the complete charging period.

Figure 1B:
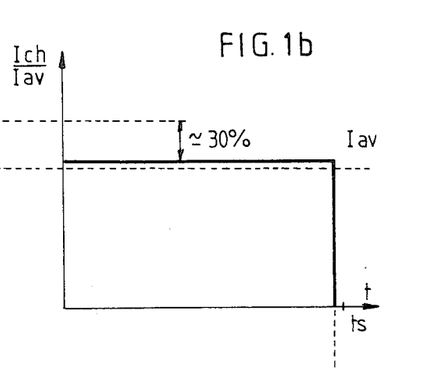
FIGS. 1b and 2b illustrate I-V characteristics for the charging method according to the invention.

In contradistinction to FIG. 1a, FIG. 1b shows that the battery charge current $I_{ch}$, according to the method of charge control of the invention, is constant during the complete charging period, the solar array being only sized for generating a current slightly greater than the average charging current theoretically required, in order that approximately 30% less than the power required by the known methods is necessary.

This is due to the fact that the invention makes use of an unknown property of Ni-Cd batteries, which presumable also applied to other types of batteries, according to which the temprature of Ni-Cd batteries increases during discharge and decreases during charge until the end of charge, when the temprature increase, this effect being most pronounced in low earth orbit applications because of the very high charge and discharge rates.

According to this property, battery charge is terminated when the battery temprature starts to increase following a decrease at the end of the charge.

Charge termination according to the new method is based on temperature measurment at individual battery cell level, which is considered to be more reliable than the techniques based on measurement at overall battery level of the prior art.

The invention also makes use of a terminal property usually valid for battery structures (see FIGS. 6a, 6b) used for low earth orbit applications, for which the individual battery cells 1 to 14 are electricaly isolated by means of a thermally conductive material i and thin metal plates p between the isolated battery cells are fixed to a common metal base plate b.

Figure 6A:
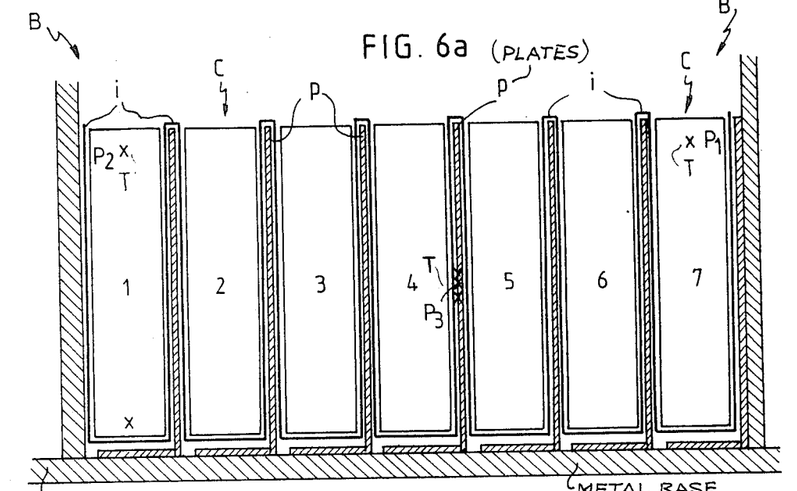
FIGS. 6a and 6b illustrate, in a side and top view, respectively, the structure of the battery for which the method according to the invention was tested.
Figure 6B:
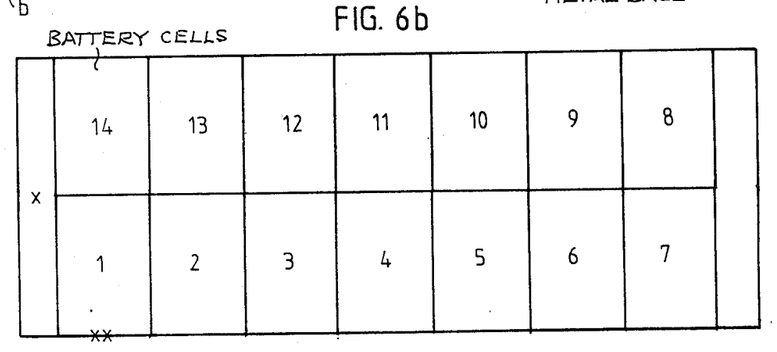

The method of charge control according to the invention takes advantage of this thermal property by measuring the temperature existing at the location of the thin metal plates p.

For this purpose, the invention makes use of a set of thermistors which are placed at special locations between the battery cells, such as at points designated by crosses $P_1$, $P_2$ on FIG. 6a, or preferably at the geometric center of the thin metal plates p, such as at the point designated by cross $P_3$ in the same FIG. 6a. These thermistors are interconnected in a series-parallel configuration (see FIG. 4a).

Tests have shown that the environmental temperature fluctuations at the location of the thin metal plates p between the isolated cells are orders of magnitude lower than the fluctuations at the base plate b. Hence the battery charge termination is virtually independent of the environmental temperature fluctuations.

Figure 7:
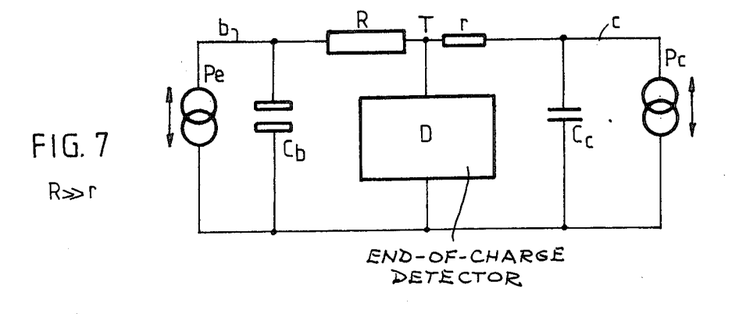
FIG. 7 shows a simplified thermal model of the detector by means of which it may be explained why the battery charge termination is virtually independent of the environmental temperature fluctuations.

This independence is explained by means of the simplified thermal model shown at FIG. 7. Since the thermal resistance R between the base plate b and the thermistor T (located on a thin metal plate) is much greater than the thermal resistance r between the battery cell c and the thermistor T, the temperature fluctuations at the location of the thermistor are almost completely caused by the thermal power $P_c$ produced by the battery cell, and therefore independent of the environmental heat power $P_e$: in FIG. 7, $C_b$ and $C_c$ represent the thermal capacities of the base plate b and of the battery cell c.

Of course, $P_c$ is positive during discharge, when the battery temperature increases (heating), but it is negative during charge when the battery temperature decreases (cooling) until the end of charge, when heating starts.

Figure 3:
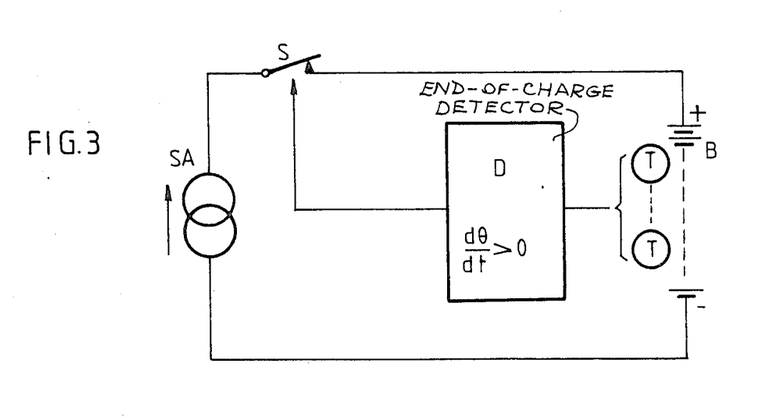
FIG. 3 represents a diagram illustrating the circuit principle according to which an end-of-charge detector implements the method according to the invention.

The diagram shown at FIG. 3 illustrates the circuit principle for implementing the method according to the invention.

During the sunlight period of the spacecraft in orbit, the switch S is closed allowing the battery B to be charged by the solar array SA which is sized, as already stated, for generating a current slightly greater than the average charging current theoretically required. At the end of charge, when the battery temperature $\theta$ starts to increase following a decrease, namely when the temperature derivative level $(d\theta/dt) > 0$, the end-of-charge detector D, which receives signals from battery thermistors T placed at the special locations, provides a signal to open switch S, which will stay open for the remainder of the sunlight period $t_s$.

Figures 4, 4A:
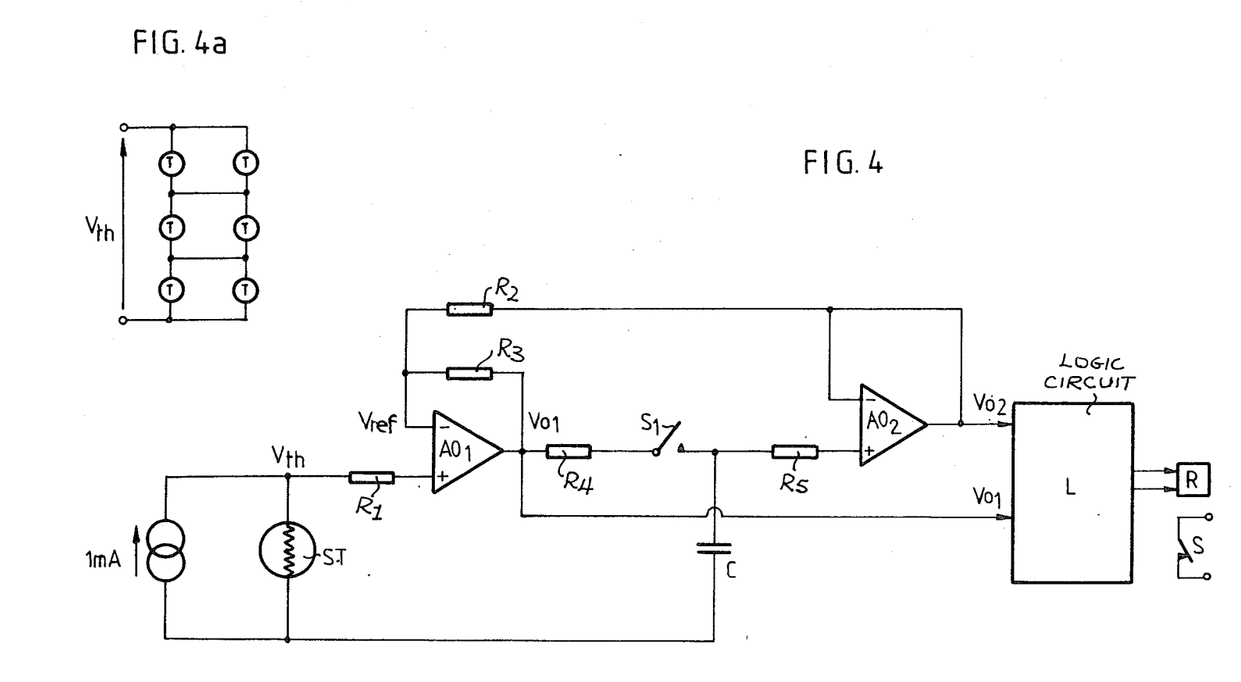
FIG. 4 shows an embodiment of the end-of-charge detector comprising a set of thermistors placed in a series-parallel configuration (see FIG. 4a) between the battery cells.

An embodiment of the end-of-charge detector is shown at FIG. 4.

A current of 1 m A is passed through a set ST of thermistors T which are interconnected in a series-parallel configuration (see FIG. 4a) and preferably placed at the geometric center of said thin metal plates p.

The voltage $V_{th}$ across the set ST of thermistors T is connected to the positive input of a first operational amplifier $AO_1$, which has a gain G of 2700.

Figure 5A:
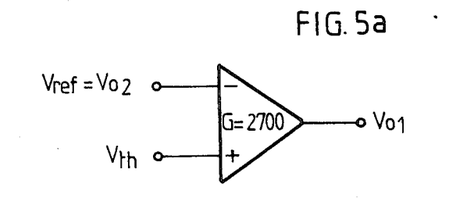
FIG. 5a shows the operational amplifier $AO_1$ used in said end-of-charge detector, in which the voltage $V_{th}$ across the set of thermistors is connected to its positive input, whereas the negative input is connected to a reference voltage $V_{ref}$.
Figure 5B:
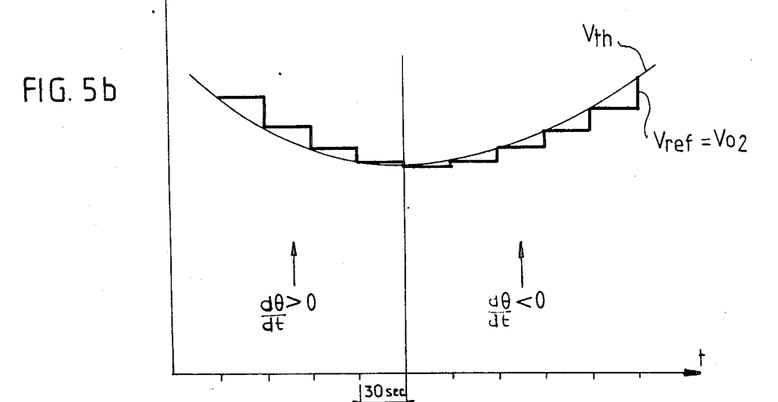
FIG. 5b illustrates the reference voltage $V_{ref}$ which is forced to be identical to the voltage $V_{th}$ across said set of thermistors each time that the switch $S_1$, represented in FIG. 4, is closed.

The negative input of the first operational amplifier $AO_1$ is connected to a reference voltage $V_{ref}$ which is the output voltage of a second operational amplifier $AO_2$, whose negative input is connected directly to its output and whose positive input is periodically connected to the output of said first operational amplifier $AO_1$ via switch $S_1$, which is open for 30 seconds and closed for 1 second. Thus, said reference voltage $V_{ref}$ is forced to be identical to $V_{th}$ each time switch $S_1$ is closed, as illustrated by the graph of FIG. 5b.

During the time that said switch $S_1$ is open, $V_{ref}$ remains constant and equal to the value that $V_{th}$ has when the switch $S_1$ is closed, because the voltage of the positive input of the second operational amplifier $AO_2$ is kept constant by means of capacitor C.

Hence the first operational amplifier $AO_1$ amplifies 2700 times the voltage difference between $V_{th}$ and $V_{ref}$ existing at its positive and negative inputs, respectively, (see FIG. 5a) during the time that switch $S_1$ is open.

Figure 5C:
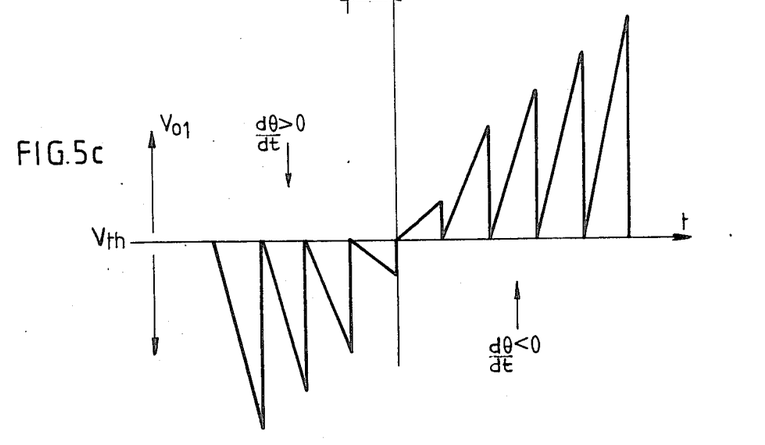
FIG. 5c shows the output voltage $V_{o1}$ of said operational amplifier $AO_1$ against time, illustrating a linear increase from the voltage $V_{th}$ across said set of thermistors, when the battery temperature drops, and a linear decrease from $V_{th}$ when the battery temperature increases.

The output voltage $V_{o1}$ of $AO_1$ against time is shown at FIG. 5c: this voltage $V_{o1}$ increases linearly from $V_{th}$ when the battery temperature decreases, namely during battery charge, whereas it decreases linearly from said voltage $V_{th}$ when the battery temperature increases, namely during battery discharge (in fact, thermistor resistance reduces for increasing temperature and vice versa).

The output voltages $V_{o1}$ and $V_{o2}$ of said first and second operational amplifiers $AO_1$ and $AO_2$ are compared by a logic circuit L, which detects the end of charge during the sunlight phase of an orbit when the battery temperature $\theta$ starts to increase, for a difference $V_{o1} - V_{o2}$ between said output voltage whose modulus is equal to a prefixed minimal threshold, e.g. $|V_{o1} - V_{o2}| = 0.5$ volt, to which corresponds a minimal positive temperature derivative level $(d\theta/dt)$ ensuring the switching off of said switch S by means of a relay R and which is calculated as follows.

If the end of charge is detected when $$V_{o1} - V_{o2} = -0.5 \text{ volt},$$

this means that:

$$\frac{dV_{th}}{dt} \cdot 30 \text{ sec} \cdot 2700 = -0.5 \text{ volt},$$

thus:

$$\frac{dV_{th}}{dt} = -6.17 \cdot 10^{-6} \text{ volt/sec}. \quad (1)$$

With the lower and upper limits of the thermistor resistance $R_{th}$, for a 2° C., being equal to 2384 ohm and 2608 ohm, respectively, this means that:

$$\left[\frac{dR_{th}}{d\theta}\right]_{\theta=20°C.} = \frac{(2384-2608) \text{ ohm}}{2° \text{ C.}} = -112 \text{ ohm/°C.},$$

thus:

$$\left[\frac{dV_{th}}{d\theta}\right]_{\theta=20°C.} = 1 \text{ mA} \cdot \left[\frac{dR_{th}}{d\theta}\right]_{\theta=20°C.} = -0.112 \text{ volt/°C.} \quad (2)$$

Hence, combining (1) and (2), the temperature derivative level for the end of charge is:

$$\frac{d\theta}{dt} = \frac{dV_{th}}{dt} \cdot \frac{d\theta}{dV_{th}} =$$

$$-6.17 \cdot 10^{-6} \frac{\text{volt}}{\text{sec}} \cdot \left(-\frac{1}{0.112} \frac{°C.}{\text{volt}}\right) =$$

$$55\mu \text{ °C./sec} \simeq 0.2 \text{ °C./hour}.$$

It has been experimentally shown that the new charging method leads to longer battery cycle life than the known methods. With the new method, the battery degrades linearly during the first few hundred cycles until steady state has been reached. After that, no further degradation is observed.

More in particular, a low earth orbit battery life test was carried out using the battery charging technique according to the invention. The test specimen consisted of a Ni-Cd battery with 14 cells each of 35 Ah. More than 7000 cycles were performed at 27% depth of discharge with a constant discharge current. The battery voltage degraded during the first 600 cycles after which no further degradation was observed.

Figure 8:
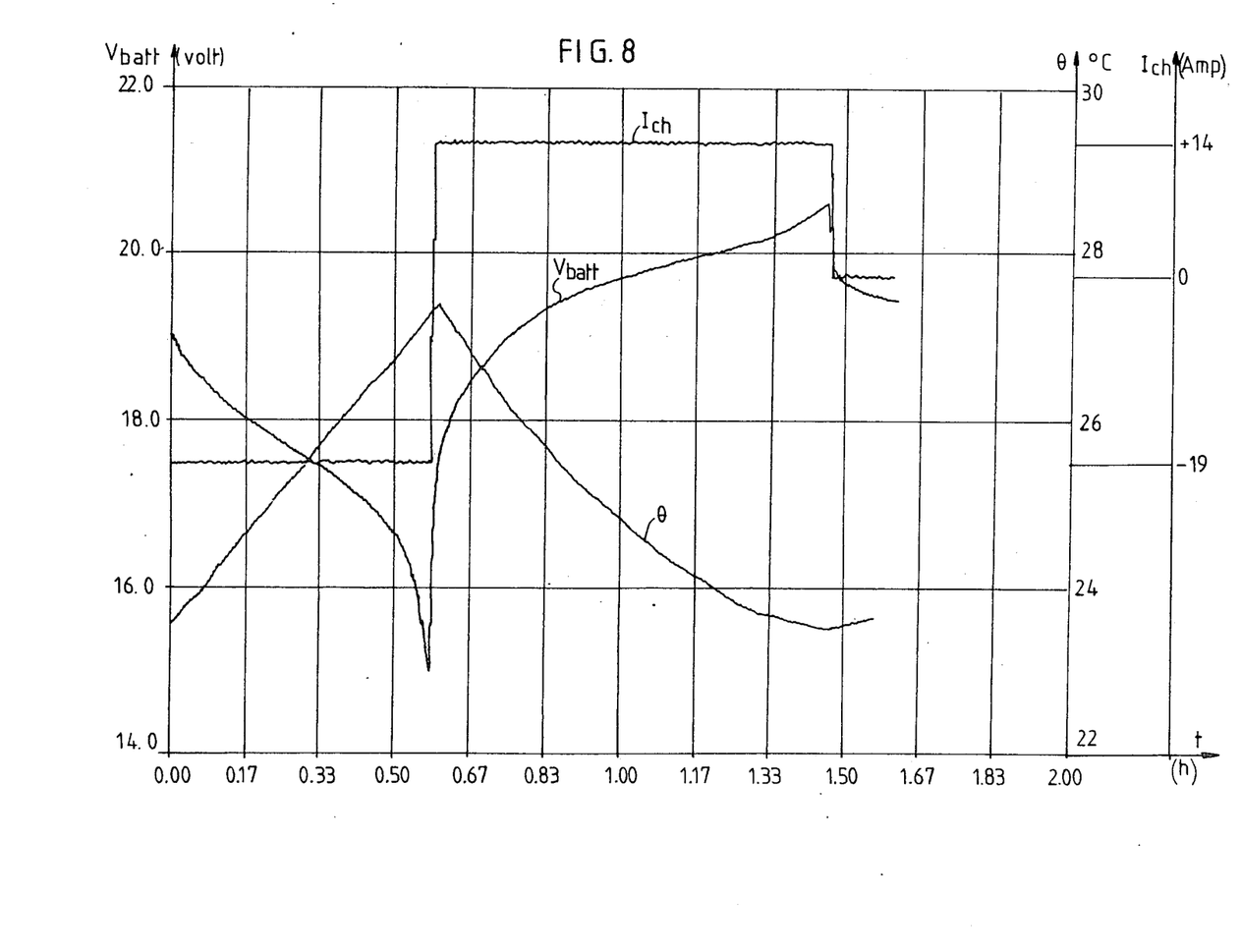
FIG. 8 illustrates the relationship between battery voltage, current and temperature for cycle n° 2000 in a low each orbit battery life test carried out for a Ni-Cd battery comprising 14 cells, each of 35 Ah, for which more than 7000 cycles were performed.

FIG. 8 illustrates the relationship between battery voltage $V_{batt}$, current $I_{ch}$ and temperature $\theta$ for cycle n° 2000. Each cycle consists of a 19 A battery discharge for about 0.5 hours followed by a 14 A battery charge until the battery temperature starts to rise at the end of charge, as detected by the detector according to the invention. The detector terminates the charge current until completion of the sunlight period (about one hour).

Similar results were obtained for a Ni-Cd battery with 4 cells of 24 Ah at 60% depth of discharge, and a combination of 3 Ni-Cd batteries each having 14 cells of 35 Ah at 27% depth of discharge.

As emerges from the foregoing, the invention is in no way limited to those of its modes of employment, embodiments and uses which have just been described more explicitly; it encompasses on the contrary all modifications which may come to the spirit of the technician skilled in the art, without departing from the scope, nor the extent, of the present invention.

I claim:

1. Method of charge control for Ni-Cd batteries, which are used in particular on a low earth orbit spacecraft, wherein said batteries are subjected to high speed charge and discharge cycles, a typical cycle lasting 1.5 hours, the individual battery cells of which are electrically isolated by means of a thermally conductive material with thin metal plates between the isolated battery cells fixed to a common metal base plate, which method comprises the steps of:
   sensing battery temperature at the location of said thin metal plates by means of suitable temperature sensors, and
   terminating battery charge by detecting a change of sign of the first derivative of the battery temperature thus sensed, when this temperature derivative becomes positive following its negative value during charge.

2. Method according to claim 1, wherein said temperature sensors are thermistor, preferably located at the geometrical centers of said thin metal plates, said thermistors being interconnected in a series-parallel configuration.

3. Circuit for charge control of Ni-Cd batteries used in particular on a low earth orbit spacecraft, wherein said batteries are subjected to high speed charge and discharge cycles, a typical cycle lasting 1.5 hours, said circuit allowing said batteries to be charged by solar array means during the sunlight period of said spacecraft when a switch S of this circuit is closed and said batteries having the individual battery cells electrically isolated by means of a thermally conductive material with thin metal plates between the isolated battery cells fixed to a common metal base plate, said circuit comprising end-of-charge detector means which detect a change of sign of the first derivative of the battery temperature, when this temperature derivative becomes positive following its negative value during charge, and which provide a signal to open said switch S which stays open for the remainder of the sunlight period, the battery temperature being sensed by suitable sensor means, placed at the location of said thin plates.

4. Circuit according to claim 3, wherein said solar array means are sized for generating a current slightly greater than the average charging current theoretically required.

5. Circuit according to claim 4, wherein said sensor means consist of a set of thermistors which are preferably located at the geometrical centers of said thin metal plates and which are interconnected in a series-parallel configuration.

6. Circuit according to claim 5, wherein said end-of-charge detector means comprise a first operational amplifier of appropriate gain, the positive input of which is connected to the voltage that appears across said set of thermistors, when a current of predetermined intensity is passed through it, and the negative input of which is connected to a reference voltage which is the output voltage of a second operational amplifier, the negative input of which is connected directly to its output and the positive input of which is periodically connected to the output of said first operational amplifier via a switch $S_1$, thus forcing said reference voltage to be identical to said voltage across the set of thermistors each time switch $S_1$ is closed, whereas said reference voltage remains constant, by means of an grounded capacitor which maintains constant the positive input of said second operational amplifier, during the time that said switch $S_1$ is open, and to be equal, during this time, to the value the voltage across the set of thermistors has when said switch $S_1$ is closed, the output voltage of said first amplifier increasing linearly from the voltage across the set of thermistors when the temperature decreases, namely during battery charge, whereas it decreases linearly from said voltage across the set of thermistors when the battery temperature increases, namely during battery discharge, in order that said first operational amplifier amplifies, according to its predetermined gain, the voltage difference between the voltage across the set of thermistors and the reference voltage only during the time that said switch $S_1$ is open.

7. Circuit according to claim 6, wherein the output voltages of said first and second operational amplifiers are compared by a logic circuit which detects the end of charge during the sunlight phase of an orbit, when the battery temperature starts to increase, for a difference between said output voltages whose modulus is equal to a prefixed minimal threshold to which corresponds a minimal positive temperature derivative level, thus switching off said switch S of the charge circuit through a relay means.

* * * * *